United States Patent
Gambino et al.

(10) Patent No.: US 7,375,039 B2
(45) Date of Patent: May 20, 2008

(54) LOCAL PLASMA PROCESSING

(75) Inventors: Jeffrey P. Gambino, Westford, VT (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 10/908,709

(22) Filed: May 24, 2005

(65) Prior Publication Data

US 2006/0269672 A1   Nov. 30, 2006

(51) Int. Cl.
*H01L 21/31* (2006.01)
*H01L 21/469* (2006.01)

(52) U.S. Cl. .............. 438/758; 257/E21.533
(58) Field of Classification Search ......... 438/758; 257/E21.533

See application file for complete search history.

(56) References Cited

U.S. PATENT DOCUMENTS

| | | | |
|---|---|---|---|
| 5,804,259 A * | 9/1998 | Robles ................ 427/577 |
| 6,042,687 A * | 3/2000 | Singh et al. ........... 156/345.33 |
| 6,045,877 A * | 4/2000 | Gleason et al. ......... 427/522 |
| 6,893,907 B2 * | 5/2005 | Maydan et al. ......... 438/149 |
| 2002/0030038 A1 | 3/2002 | Bollinger et al. | |
| 2002/0094388 A1* | 7/2002 | Fonash et al. .......... 427/579 |
| 2002/0134403 A1 | 9/2002 | Selwyn et al. | |
| 2003/0049390 A1* | 3/2003 | Shanmugasundram et al. ............. 427/585 |
| 2003/0116281 A1 | 6/2003 | Herbert et al. | |
| 2003/0129107 A1 | 7/2003 | Denes et al. | |
| 2003/0196680 A1* | 10/2003 | Lee et al. ............ 134/1.1 |
| 2003/0213561 A1 | 11/2003 | Selwyn et al. | |
| 2004/0050685 A1 | 3/2004 | Yara et al. | |
| 2004/0091642 A1 | 5/2004 | Murakami et al. | |
| 2004/0187783 A1 | 9/2004 | Maeda et al. | |
| 2006/0228897 A1* | 10/2006 | Timans ................ 438/758 |

FOREIGN PATENT DOCUMENTS

| JP | 2003268553 A | 9/2003 |
|---|---|---|
| JP | 2004137571 A | 5/2004 |
| WO | WO 2004012235 A2 | 2/2004 |

* cited by examiner

*Primary Examiner*—Scott B. Geyer
*Assistant Examiner*—Seahvosh J Nikmanesh
(74) *Attorney, Agent, or Firm*—Schmeiser, Olsen & Watts; William D. Sabo

(57) ABSTRACT

A method and an apparatus for performing the method. The method includes: (a) providing an apparatus, wherein the apparatus comprises (i) a chamber, (ii) a plasma device being in and coupled to the chamber, (iii) a shower head being in and coupled to the chamber, and (iv) a chuck being in and coupled to the chamber; (b) placing the substrate on the chuck; (c) using the plasma device to receive a plasma device gas and generate a plasma; (d) directing the plasma at a pre-specified area on the substrate; and (e) using the shower head to receive and distribute a shower head gas in the chamber, wherein the plasma device gas and the shower head gas are selected such that the plasma and the shower head gas when mixed with each other result in a chemical reaction that forms a film at the pre-specified area on the substrate.

4 Claims, 3 Drawing Sheets

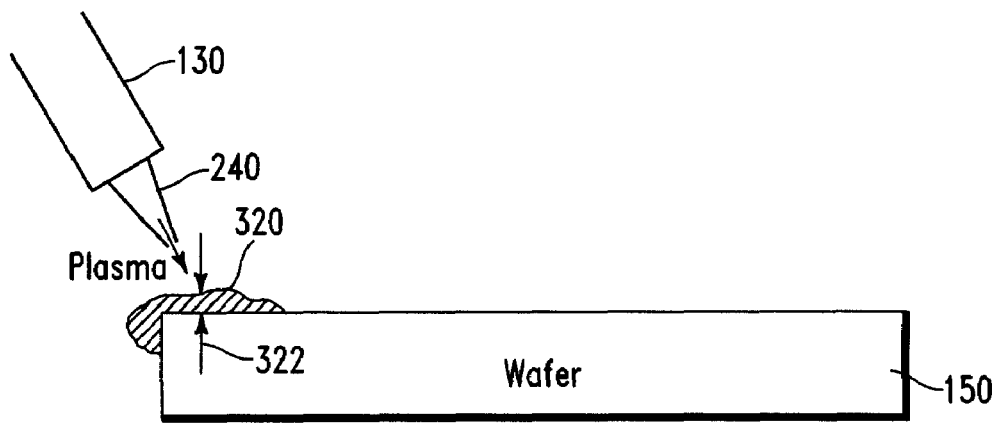
FIG. 3
| Film 320 | Showerhead Gas | Plasma Device Gas |
|----------|----------------|-------------------|
| $SiO_2$ | $SiH_4$ | $O_2, N_2O, NO, CO_2,$ or $CO$ |
| SiN | $SiH_4$ | $N_2, NH_3$ |
| W | inert gas and $H_2$ | $WF_6$ |
FIG. 4
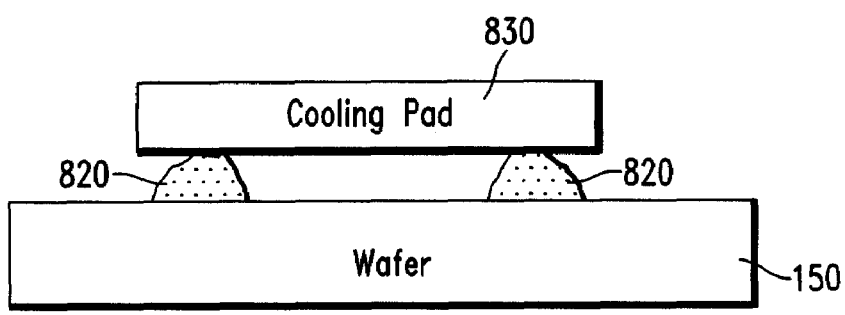
FIG. 8

LOCAL PLASMA PROCESSING

BACKGROUND OF THE INVENTION

1. Technical Field

The present invention relates to plasma processing, and more specifically, to local plasma processing.

2. Related Art

In a typical semiconductor structure fabrication process, the deposition of a film on a wafer can frequently result in the film being thinner on the edge of the wafer than on other parts of the wafer (i.e., under-deposition at wafer edge). In addition, a chemical mechanical polishing (CMP) process performed on the wafer usually has a higher CMP rate at the edge of the wafer than at other parts of the wafer (i.e., over-polish at wafer edge). As a result, integrated circuits formed near the edge of the wafer may be damaged by this nonuniformity.

Therefore, there is a need for a method (and an apparatus for performing the method) to compensate for the problems of under-deposition and over-polish at the edge of a wafer.

SUMMARY OF THE INVENTION

The present invention provides a structure processing method, comprising providing an apparatus, wherein the apparatus comprises (i) a chamber, (ii) a plasma device being in and coupled to the chamber, (iii) a shower head being in and coupled to the chamber, and (iv) a chuck being in and coupled to the chamber; placing a substrate on the chuck; using the plasma device to receive a plasma device gas and generate a plasma; directing the plasma at a pre-specified area on the substrate; and using the shower head to receive and distribute a shower head gas in the chamber, wherein the plasma device gas and the shower head gas are selected such that the plasma and the shower head gas when mixed with each other result in a chemical reaction that forms a film at the pre-specified area on the substrate.

The present invention also provides a structure processing method, comprising providing an apparatus, wherein the apparatus comprises (i) a chamber, (ii) a plasma device being in and coupled to the chamber, and (iii) a chuck being in and coupled to the chamber; placing a substrate on the chuck; using the plasma device to receive a plasma device gas and generate a plasma; and directing the plasma at a pre-specified area on the substrate, wherein the plasma device gas is selected such that particles of the plasma bombard the pre-specified area on the substrate essentially without chemically reacting with materials of the pre-specified area on the substrate.

The present invention provides a method (and an apparatus for performing the method) to compensate for the problems of under-deposition and over-polish at the edge of a wafer.

BRIEF DESCRIPTION OF THE DRAWINGS

FIGS. 3-8 illustrate different uses of the apparatus of FIG. 1, in accordance with embodiments of the present invention.

DETAILED DESCRIPTION OF THE INVENTION

Figure 1:
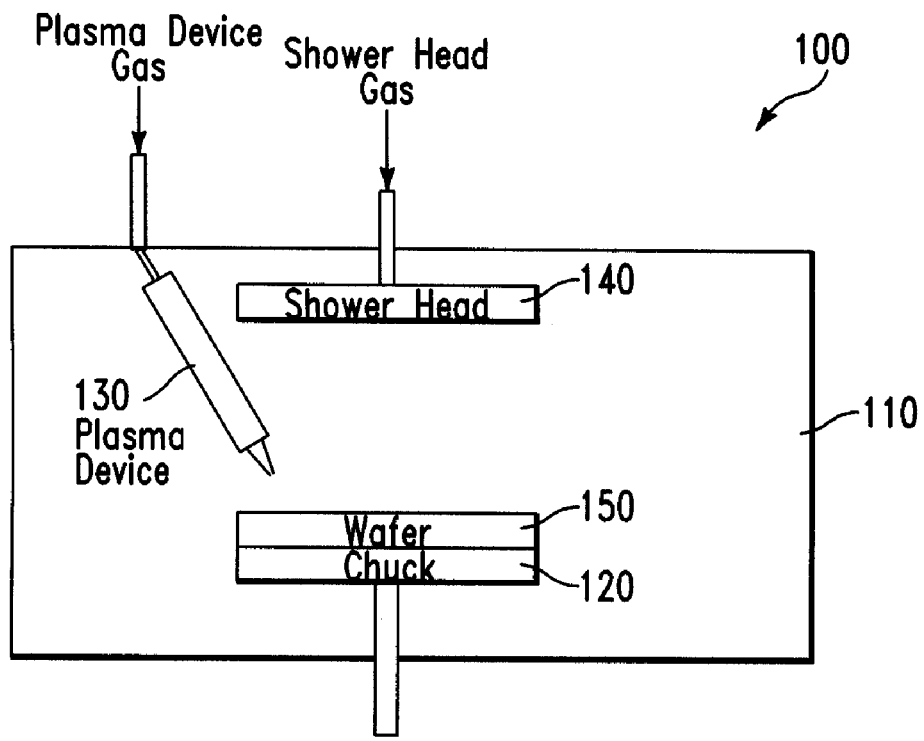
FIG. 1 illustrates an apparatus, in accordance with embodiments of the present invention.

FIG. 1 illustrates an apparatus 100, in accordance with embodiments of the present invention. In one embodiment, the apparatus 100 comprises a chamber 110, a chuck 120, a plasma device 130, and a shower head 140.

The chuck 120 is adapted for holding a wafer 150 for processing. The plasma device (also called plasma jet) 130 is adapted for receiving a plasma device gas and then generating a plasma at atmospheric pressure (i.e., around 1 atm) for processing a pre-specified area of the wafer 150. The shower head 140 is adapted for receiving and distributing a shower head gas into the chamber 110.

Figure 2:
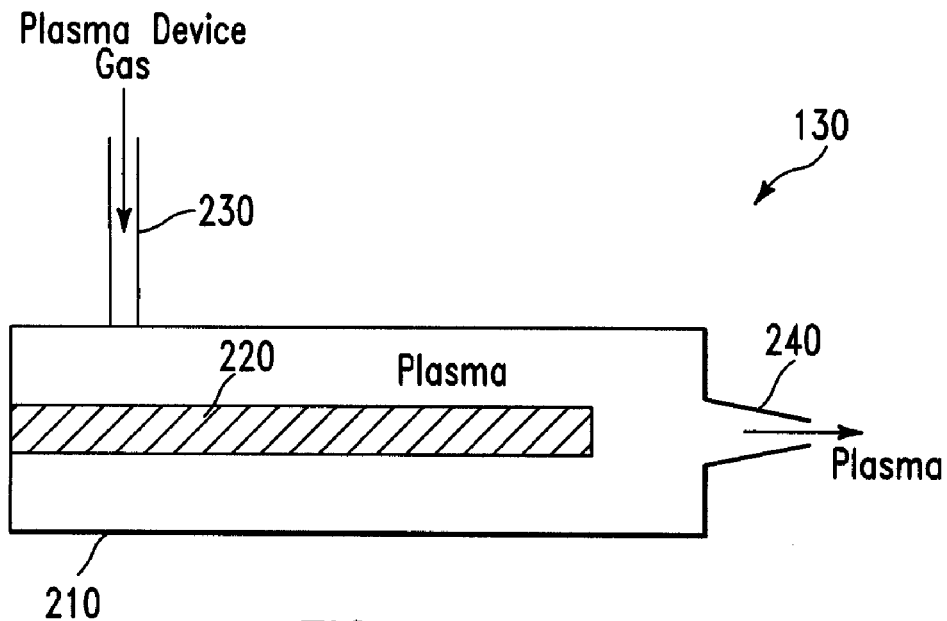
FIG. 2 illustrates a plasma device of the apparatus of FIG. 1, in accordance with embodiments of the present invention.

FIG. 2 illustrates one embodiment of the plasma device 130 of FIG. 1, in accordance with embodiments of the present invention. Illustratively, the plasma device 130 comprises (i) a container 210 that also serves as a ground electrode of the plasma device 130, (ii) a radio frequency electrode 220, (iii) a gas inlet 230, and (iv) a nozzle 240. The plasma device 130 is adapted for receiving the plasma device gas via the gas inlet 230, creating a plasma inside the container 210, and outputting the plasma via the nozzle 240.

With reference to FIGS. 1 and 2, in one embodiment, either or both of the plasma device 130 and the chuck 120 are moved with respect to the chamber 110 such that the plasma output by the plasma device 130 via the nozzle 240 is directed at the pre-specified area of the wafer 150. In addition, the plasma device gas and the shower head gas are selected such that the plasma output by the plasma device 130 and the shower head gas distributed by the shower head 140 when mixed with each other will result in chemical reactions forming a film (not shown) on the pre-specified area of the wafer 150. After the film is deposited, if another film (not shown) is needed at another pre-specified area of the wafer 150, the plasma output is re-directed at the another pre-specified area of the wafer 150.

In an alternative embodiment, the plasma device gas is selected such that the plasma output by the plasma device 130 contains high ion densities that (i) drive off volatile constituents on the wafer 150 (i.e., drying) or (ii) modify a thin film (not shown) for the purpose of densification, annealing, curing, or cross-linking in the case of polymeric systems on the wafer 150. For example, in one embodiment, the plasma device gas includes inert gases (e.g., Ar, etc.) or N2 so that the resultant plasma contains radicals that drive off rinsing species from the pre-specified area of the wafer 150. After the pre-specified area of the wafer 150 is dried off, if another pre-specified area of the wafer 150 needs drying, either or both of the plasma device 130 and the chuck 120 are moved with respect to the chamber 110 such that the plasma output by the plasma device 130 via the nozzle 240 is directed at the another pre-specified area of the wafer 150. The same plasma device gas (i.e., Ar or N2) can be used to densify, anneal, cure, or cross-link a film on the wafer 150 by heating the film to a high temperature. It should be noted that the plasma device gas is also selected such that the resultant plasma essentially does not chemically react with any material of the wafer 150.

In one embodiment, the shower head 140 is omitted if the apparatus 100 of FIG. 1 is to be used to (i) drive off volatile constituents on the wafer 150 (i.e., drying) or (ii) densify, anneal, cure, or cross-link a film on the wafer 150 by heating the film to a high temperature.

FIGS. 3-8 illustrate different uses of the apparatus 100 of FIG. 1, in accordance with embodiments of the present invention. More specifically, with reference to FIG. 3, the apparatus 100 (FIG. 1) is used for depositing a film 320 at a pre-specified location on the wafer 150. For simplicity, hereafter, only the plasma device 130 instead of the entire apparatus 100 of FIG. 1 is shown in the figures. The positions of the plasma device 130 and/or the chuck 120 with respect to the chamber 110 are such that the nozzle 240 is pointed to the pre-specified location on the wafer 150. In one embodiment, when the plasma generated by the plasma device 130 exits the plasma device 130 at the nozzle 240, the plasma is mixed with the shower head gas distributed by the shower head 140 resulting in chemical reactions producing a material that deposits on the pre-specified location on the wafer 150 as the film 320. The material may also deposit at other areas of the wafer 150 but with negligible amounts.

FIG. 4 is a table listing some illustrative film materials of the film 320 (FIG. 3) and the corresponding plasma device gas and shower head gas that may be used to create the film 320 (FIG. 3). With reference to both FIGS. 3 and 4, for instance, assume the film 320 is to comprise silicon dioxide (SiO2). Then, silane (SiH4) may be used as the showerhead gas, and one or more of the group comprising O2, N2O, NO, CO2, and CO may be used as the plasma device gas. For instance, if oxygen (O2) is used as the plasma device gas, then the following chemical reaction occurs outside the nozzle 240 where the oxygen plasma exits the plasma device 130 and is mixed with the showerhead gas: SiH4+O2àSiO2+2H2. As a result, the resultant SiO2 deposits on the pre-specified location on the wafer 150. In one embodiment, the pressure of the ambient inside the chamber 110 (FIG. 1) is atmospheric (i.e., 1 atm) during the deposition. The flow rate for oxygen (plasma device gas) in the plasma device 130 is in a range of 10-1,000 sccm (Standard Cubic Centimeters per Minute). The flow rate of silane (showerhead gas) is in a range of 10-1,000 sccm. To maintain the chamber 110 (FIG. 1) at atmospheric pressure, a dilutant gas (e.g., oxygen in this example) may be added in the showerhead gas (in addition to silane) at a flow rate in a range of 100-10,000 sccm.

As another example, assume the film 320 is to comprise tungsten (W). Then, inert gas (e.g., argon) and hydrogen (H2) may be used as the showerhead gas, and WF6 may be used as the plasma device gas. Then, the following chemical reaction occurs outside the nozzle 240 where the plasma exits the plasma device 130 and is mixed with the showerhead gas: WF6+3H2àW+6HF. As a result, the resultant tungsten (W) deposits on the pre-specified location on the wafer 150.

With reference to FIG. 3, in one embodiment, the film 320 is formed at the edge of the wafer 150 so as to compensate for under-deposition and/or over-polish (i.e., over-planarization) at the edge of the wafer 150. In general, films (not shown) similar to the film 320 may be formed at locations (not necessarily at the wafer edge) of the wafer 150 that are thinner than average so as to compensate for an earlier over-etching and/or a subsequent under-deposition at these locations (over-etching and under-deposition may occur due to pattern/topology nonuniformity). For example, assume a tungsten layer (not shown) deposited on the wafer 150 using a traditional deposition method is thinner at first areas of high device density than at second areas of low device density. Then, the apparatus 100 of FIG. 1 may be used to deposit more tungsten (W) at the first areas where the W layer is thinner so as to compensate for the earlier under-deposition of tungsten there.

In one embodiment, the plasma device 130 can be stationary (i.e., fixed) with respect to the chamber 110 (FIG. 1) while the wafer 150 is rotated around an axis perpendicular to the wafer 150. Deposition time is such that the resultant film 320 has a thickness 322 not less than the required minimum thickness. For example, assume that a typical SiO2 film (not shown) deposited on top of the wafer 150 must have a thickness of at least 20 nm, and that the apparatus 100 (FIG. 1) deposits SiO2 at 2 nm/wafer rotation. As a result, the deposition time (in terms of rotations) must be at least: 20 nm/(2 nm/rotation)=10 rotations in this example. Assume further that it takes 1 sec for the wafer 150 to make one rotation. Then, the deposition time must be at least: 10 rotations×1 sec/rotation=10 sec.

Figure 5:
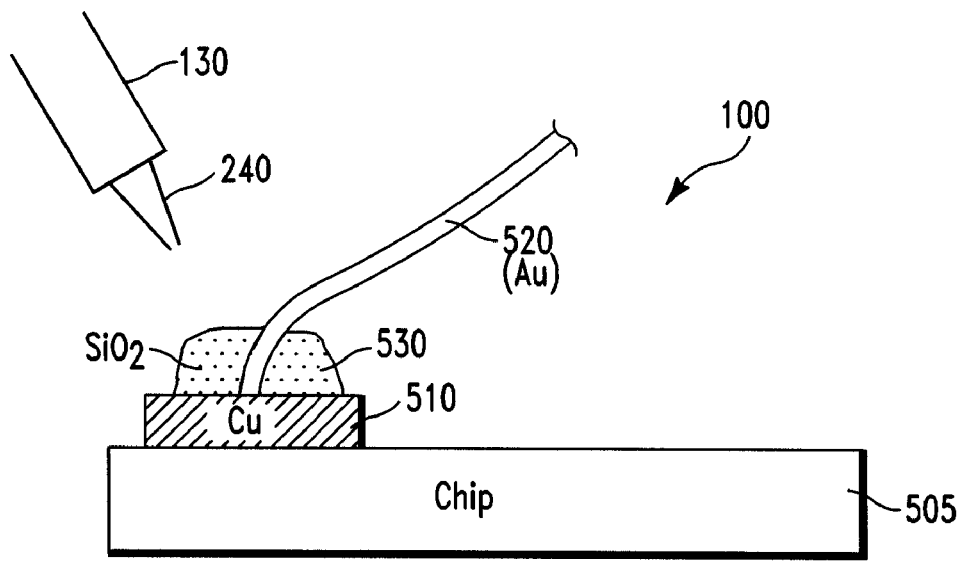

FIG. 5 illustrates another use of the apparatus 100 (FIG. 1), in accordance with embodiments of the present invention. More specifically, a chip 505 including a copper wire bond landing pad 510 and a gold wire bond 520 is placed on the chuck 120 of the apparatus 100 (FIG. 1). Then, a SiO2 film 530 is deposited so as to seal off the connection between the copper pad 510 and the gold wire bond 520. As a result, the connection between the copper pad 510 and the gold wire bond 520 is protected from corrosion. In an alternative embodiment, the film 530 comprises SiN (silicon nitride) instead of SiO2. In yet another alternative embodiment, the film 530 comprises first and second layers (not shown) of SiN and SiO2, respectively, with the first layer of SiN being sandwiched between and in direct physical contact with the copper wire bond landing pad 510 and the second layer of SiO2. Illustratively, the apparatus 100 (FIG. 1) can be used to form the first layer of SiN on the copper wire bond landing pad 510 first, and then form the second layer of SiO2 on the first layer of SiN resulting in the film 530.

Figure 6:
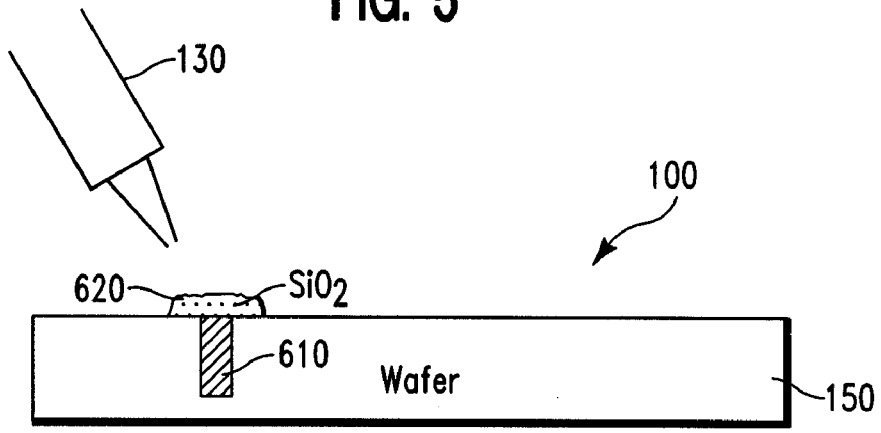

FIG. 6 illustrates yet another use of the apparatus 100 (FIG. 1), in accordance with embodiments of the present invention. More specifically, the apparatus 100 of FIG. 1 is used to deposit a SiO2 film 620 so as to passivate (seal off) a top surface of a crackstop/through via 610 so as to protect the crackstop/through via 610 from corrosion. The crackstop/through via 610 usually comprises an electrically conducting material (e.g., Al, Cu, and W). Therefore, the SiO2 film 620 helps prevent corrosion of this electrically conducting material. In an alternative embodiment, the film 620 comprises SiN (silicon nitride) instead of SiO2. In yet another alternative embodiment, the film 620 comprises third and fourth layers (not shown) of SiN and SiO2, respectively, with the third layer of SiN being sandwiched between and in direct physical contact with the crackstop/through via 610 and the fourth layer of SiO2. Illustratively, the apparatus 100 (FIG. 1) can be used to form the third layer of SiN on the crackstop/through via 610 first, and then form the fourth layer of SiO2 on the third layer of SiN resulting in the film 620.

Figure 7:
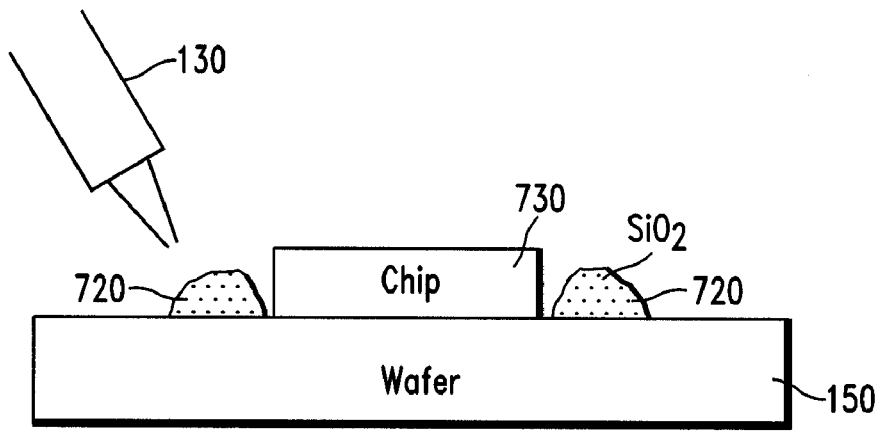

FIG. 7 illustrates yet another use of the apparatus 100 (FIG. 1), in accordance with embodiments of the present invention. More specifically, the apparatus 100 of FIG. 1 is used to precisely deposit a SiO2 ring 720 on the wafer 150. Then, a chip 730 is placed on the wafer 150 and inside the ring 730. In other words, the ring 720 serves as a positioning reference for the placing of the chip 730. Because the SiO2 ring 720 can be placed on the wafer 150 at a pre-specified location with high precision, the chip 730 can be placed on the wafer 150 at the specified location also with high precision.

FIG. 8 illustrates yet another use of the apparatus 100, in accordance with embodiments of the present invention. More specifically, the apparatus 100 of FIG. 1 is used to deposit a ring 820 at a pre-specified location on the wafer 150. Then, a cooling pad 830 is placed on the ring 820 without being in direct physical contact with the wafer 150.

The cooling pad 830 is adapted for absorbing the heat generated by devices (not shown) formed on the wafer 150 directly beneath the cooling pad 830. In one embodiment, the ring 820 comprises SiO2.

In summary, with reference to FIG. 1, the apparatus 100 may be used to deposit films of different materials at pre-specified locations on the wafer 150. The apparatus 100 may also be used to (i) drive off volatile constituents on the wafer 150 (i.e., drying) or (ii) modify a thin film (e.g., densification, annealing, curing, or cross-linking of the film) on the wafer 150.

In one embodiment, the apparatus 100 has multiple plasma devices (not shown) similar to the plasma device 130 so that (a) multiple films (not shown) similar to the film 320 (FIG. 3) can be simultaneously formed on different pre-specified locations of the wafer 150, and (b) different pre-specified locations of the wafer 150 can be simultaneously dried by directing the plasma outputs of the multiple plasma devices at the different pre-specified locations of the wafer 150.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure processing method, comprising:
    providing an apparatus, wherein the apparatus comprises:
        (i) a chamber,
        (ii) a plasma device being in and coupled to the chamber,
        (iii) a shower head being in and coupled to the chamber, and
        (iv) a chuck being in and coupled to the chamber;
    placing a substrate on the chuck;
    using the plasma device to receive a plasma device gas and generate a plasma;
    directing the plasma at a pre-specified area on the substrate;
    using the shower head to receive and distribute a shower head gas in the chamber, wherein the plasma device gas and the shower head gas are selected such that the plasma and the shower head gas when mixed with each other result in a chemical reaction that forms a film at the pre-specified area on the substrate; and
    placing a chip on the substrate with the film being a positioning reference for said placing the chip.

2. The method of claim 1, wherein the film has a form of a ring, and wherein the chip is placed inside the ring.

3. A structure processing method, comprising:
    providing an apparatus, wherein the apparatus comprises:
        a chamber,
        (ii) a plasma device being in and coupled to the chamber,
        (iii) a shower head being in and coupled to the chamber, and
        (iv) a chuck being in and coupled to the chamber;
    placing a substrate on the chuck;
    using the plasma device to receive a plasma device gas and generate a plasma,
    directing the plasma at a pre-specified area on the substrate;
    using the shower head to receive and distribute a shower head gas in the chamber, wherein the plasma device gas and the shower head gas are selected such that the plasma and the shower head gas when mixed with each other result in a chemical reaction that forms a film at the pre-specified area on the substrate; and
    placing a cooling pad on the film, wherein the cooling pad is not in direct physical contact with the substrate.

4. A structure processing method, comprising:
    providing an apparatus, wherein the apparatus comprises:
        (i) a chamber,
        (ii) a plasma device being in and coupled to the chamber, and
        (iii) a chuck being in and coupled to the chamber;
    placing a substrate on the chuck;
    using the plasma device to receive a plasma device gas and generate a plasma; and
    directing the plasma at a pre-specified area on the substrate, wherein the plasma device gas is selected such that particles of the plasma bombard the pre-specified area on the substrate essentially without chemically reacting with materials of the pre-specified area on the substrate;
    wherein the apparatus further comprises another plasma device being in and coupled to the chamber, wherein the method further comprises:
        using the another plasma device to receive the plasma device gas and generate another plasma, and
        directing the another plasma at another pre-specified area on the substrate so as to dry off the another pre-specified area on the substrate.

* * * * *